United States Patent
Yeh et al.

(10) Patent No.: US 9,748,900 B2
(45) Date of Patent: Aug. 29, 2017

(54) LOW NOISE AMPLIFIER

(71) Applicant: TAIWAN SEMICONDUCTOR MANUFACTURING CO., LTD., Hsinchu (TW)

(72) Inventors: En-Hsiang Yeh, Hsinchu (TW); An-Hsun Lo, Hsinchu (TW); Tzu-Jin Yeh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/983,870

(22) Filed: Dec. 30, 2015

(65) Prior Publication Data

US 2017/0194910 A1    Jul. 6, 2017

(51) Int. Cl.
  *H03F 3/45* (2006.01)
  *H03F 1/02* (2006.01)
  *H03F 3/19* (2006.01)

(52) U.S. Cl.
  CPC ............. *H03F 1/0205* (2013.01); *H03F 3/19* (2013.01); *H03F 2200/294* (2013.01); *H03F 2200/451* (2013.01)

(58) Field of Classification Search
  CPC .................................. H03F 1/3211; H03F 3/45
  USPC .......................... 330/252, 253, 254; 327/359
  See application file for complete search history.

(56) References Cited

U.S. PATENT DOCUMENTS 6,605,996 B2 *   8/2003  Yu ........................ H03F 3/45179
                                                       330/253
2011/0304392 A1 * 12/2011 Zanchi .................. H03F 1/3211
                                                       330/253

OTHER PUBLICATIONS

Donggu Im et al., "A Wideband CMOS Low Noise Amplifier Employing Noise and IM2 Distortion Cancellation for a Digital TV Tuner", IEEE Journal of Solid-State Circuits, vol. 44, No. 3, Mar. 2009.
Yong-Sik Youn et al., "A 2GHz 16dBm IIP3 Low Noise Amplifier in 0.25μm CMOS Technology", 2003 IEEE International Solid-State Circuits Conference, ISSCC 2003 / Session 25 / RF Infotainment / Paper 25.7. 2003.

* cited by examiner

*Primary Examiner* — Steven J Mottola
(74) *Attorney, Agent, or Firm* — Maschoff Brennan

(57) ABSTRACT

A device is disclosed that includes a first gain stage and a first amplifier. The first gain stage is configured to generate a first signal according to a first input signal, and to multiply the first signal and the first input signal, to generate a second signal at a first output terminal, in which the first signal is associated with the even order signal components of the first input signal. The first amplifier is configured to amplify the first input signal to generate a third signal at the first output terminal, in order to output a first output signal with the first gain stage, in which the first output signal is the sum of the second signal and the third signal.

20 Claims, 5 Drawing Sheets

LOW NOISE AMPLIFIER

BACKGROUND

A radio receiver includes a low noise amplifier (LNA), and amplifies radio frequency signals received by an antenna. A radio receiver is common used\in various devices, including, for example, mobile communication devices. To maintain the accuracy of the incoming data, the low noise amplifier is designed to have a high linearity. However, in some approaches, there is a trade-off between the power consumption and the linearity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
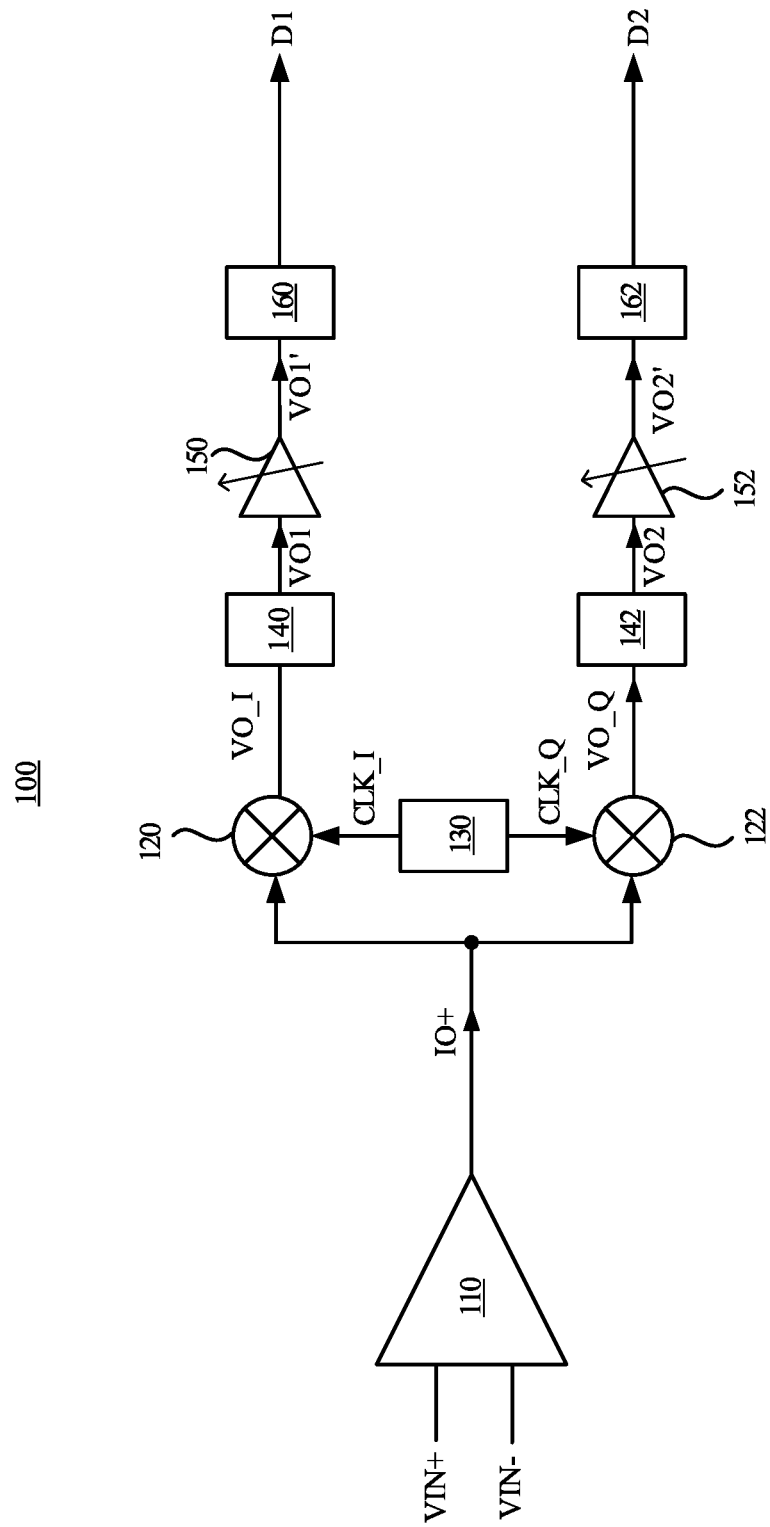
FIG. 1 is a schematic diagram of a device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is now made to FIG. 1. FIG. 1 is a schematic diagram of a device 100, in accordance with some embodiments of the present disclosure. In some embodiments, the device 100 is configured to operate as a receiver. In some other embodiments, the device 100 is applied in a transceiver.

As illustratively shown in FIG. 1, the device 100 includes a low noise amplifier 110, mixers 120 and 122, an oscillator 130, filters 140 and 142, programmable gain amplifiers 150 and 152, and signal processing circuits 160 and 162. The low noise amplifier 110 is configured to receive input signals VIN+ and VIN−, and amplify the input signals VIN+ and VIN− to generate an output signal IO+. The oscillator 130 is coupled to the mixers 120 and 122. The oscillator 130 is configured to generate clock signals CLK_I and CLK_Q to the mixers 120 and 122, respectively. In some embodiments, the clock signal CLK_I and the clock signal CLK_Q are different in phase by about 90 degrees. The mixers 120 and 122 are coupled to the low noise amplifier 110. The mixer 120 is configured to modulate the output signal IO+ according to the clock signal CLK_I, to generate a signal VO_I. The mixer 122 is configured to modulate the output signal IO+ according to the clock signal CLK_Q, to generate a signal VO_Q. The filter 140 is coupled to the mixer 120. The filter 140 is configured to remove signal components or noises, which are above an unwanted frequency, in the signal VO_I, to generate a signal VO1. The filter 142 is coupled to the mixer 122. The filter 142 is configured to remove signal components or noises, which are above the unwanted frequency, in the signal VO_Q, to generate a signal VO2.

The programmable gain amplifier 150 is coupled between the filter 140 and the signal processing circuit 160. The programmable gain amplifier 150 is configured to amplify the signal VO1, and transmit the amplified signal VO1' to the signal processing circuit 160. The programmable gain amplifier 152 is coupled between the filter 142 and the signal processing circuit 162. The programmable gain amplifier 152 is configured to amplify the signal VO2, and transmit the amplified signal VO2' to the signal processing circuit 162. The signal processing units 160 and 162 are configured to process the signals VO1' and VO2', respectively, in order to read data carried in the signals VO1' and VO2'. For example, in some embodiments, each of the signal processing units 160 and 162 includes an analog-to-digital converter. The analog-to-digital converter is configured to convert the signals VO1' and VO2' to digital codes D1 and D2 for subsequent digital processing.

The arrangements of the device 100 are given for illustrative purposes only. Various arrangements of the device 100 are within the contemplated scope of the present disclosure. For example, in some other embodiments, the device 100 is able to be operated with a single-end input architecture.

The following paragraphs describe certain embodiments related to the low noise amplifier 110 to illustrate functions and applications thereof. However, the present disclosure is not limited to the following embodiments. Various arrangements are able to implement the functions and the operations of the low noise amplifier 110 in FIG. 1 are within the contemplated scope of the present disclosure.

Figure 2:
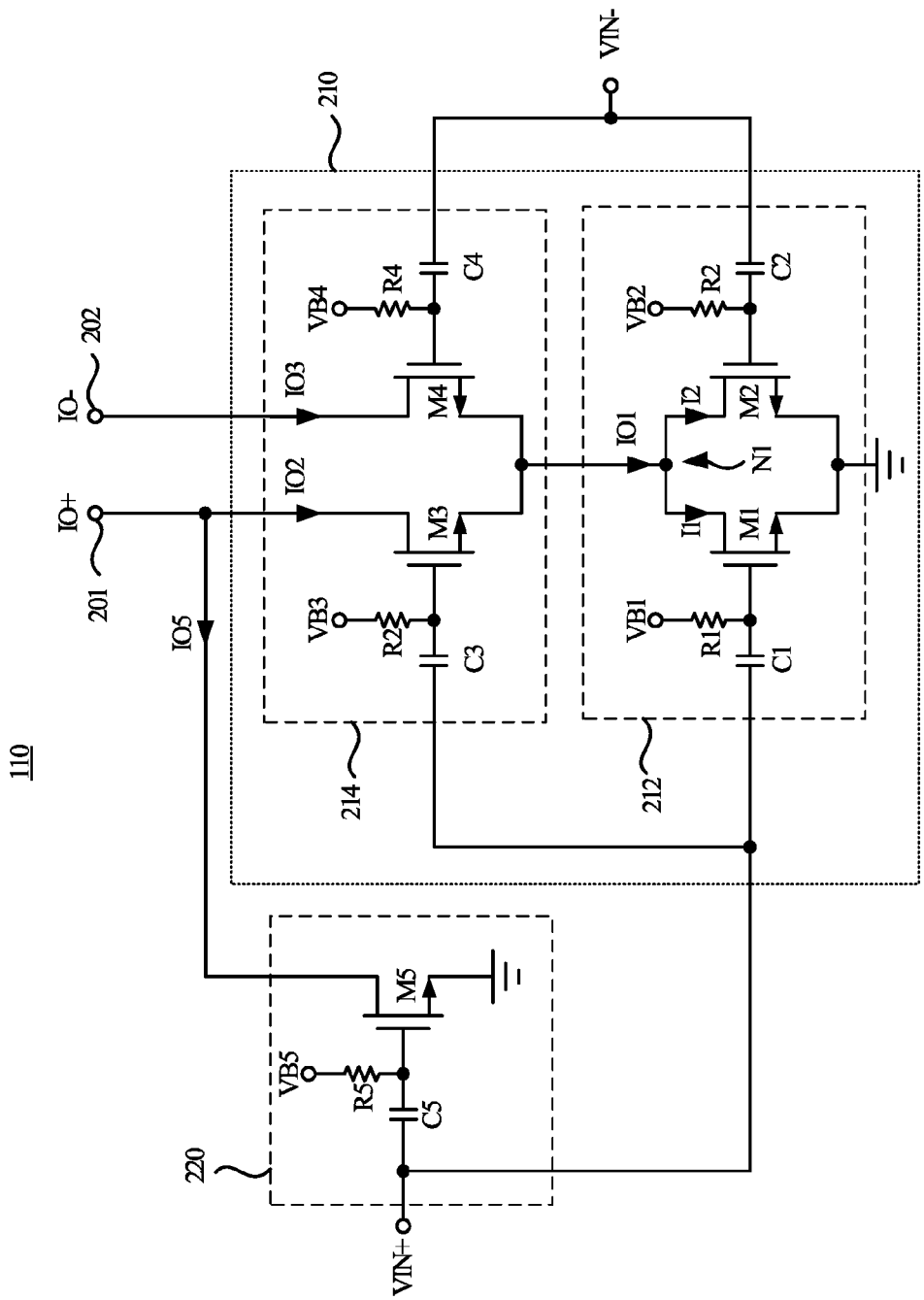
FIG. 2 is a circuit diagram of the low noise amplifier in FIG. 1, in accordance with some embodiments of the present disclosure.

Reference is now made to FIG. 2. FIG. 2 is a circuit diagram of the low noise amplifier 110 in FIG. 1, in accordance with some embodiments of the present disclosure. With respect to the embodiments of FIG. 1, like elements in FIG. 2 are designated with the same reference numbers for ease of understanding.

As illustratively shown in FIG. 2, in some embodiments, the low noise amplifier 110 includes a gain stage 210 and an amplifier 220. The gain stage 210 is coupled to the amplifier 220 at an output terminal 201. In some embodiments, the gain stage 210 includes an odd order remover 212 and a multiplier 214. The odd order remover 212 is configured to generate a signal IO1 at a node N1 according to the input signal VIN+ and the input signal VIN−. In some embodiments, the odd order remover 212 is configured to operate as a square current generator. In some embodiments, when the device 100 in FIG. 1 is operated with a single-ended input architecture, the input signal VIN− in FIG. 2 is generated from a gain stage, having a negative gain equivalent to minus one, according to the input signal VIN+. In some alternative embodiments, when the device 100 in FIG. 1 is operated with differential inputs, the input signal VIN+ and the input signal VIN− in FIG. 2 are different in phase by about 180 degrees. The multiplier 214 is configured to multiply the signal IO1 and the input signals VIN+ and VIN−, to generate a signal IO2 at the output terminal 201 and IO3 at an output terminal 202. The amplifier 220 is configured to amplify the input signal VIN+, to generate a signal IO5. In some embodiments, the amplifier 220 is configured to generate the output signal IO+ at the output terminal 201 with the gain stage 210. The output signal IO+ is the sum of the signal IO5 and the signal IO2.

In some embodiments, the odd order remover 212 includes transistors M1 and M2, capacitors C1 and C2, and resistor R1 and R2. A first terminal of the transistor M1 is coupled to the node N1, a second terminal of the transistor M1 is coupled to ground, and a control terminal of the transistor M1 is coupled to a first terminal of the capacitor C1 and a first terminal of the resistor R1. The second terminal of the capacitor C1 is configured to receive the input signal VIN+. In other words, the control terminal of the transistor M1 is configured to receive the input signal VIN+ via the capacitor C1. Effectively, the transistor M1 is ac-coupled to an input terminal of the low noise amplifier 110, to receive the input signal VIN+. The resistor R1 is configured to bias the transistor M1 according to a bias voltage VB1. With such arrangements, the transistor M1 is able to generate a current I1 at the node N1 according to AC signal components in the signal VIN+.

A first terminal of the transistor M2 is coupled to the node N1, a second terminal of the transistor M2 is coupled to ground, and a control terminal of the transistor M2 is coupled to a first terminal of the capacitor C2 and a first terminal of the resistor R2. The second terminal of the capacitor C2 is configured to receive the input signal VIN−. Effectively, the transistor M2 is ac-coupled to another input terminal of the low noise amplifier 110, to receive the input signal VIN−. The resistor R2 is configured to bias the transistor M2 according to a bias voltage VB2. The transistor M2 is able to generate a current I2 at the node N1 according to AC signal components in the signal VIN−. Accordingly, the signal IO1 is the sum of the current I1 and the current I2. Effectively, the signal IO1 is generated by the transistors M1-M2.

In some embodiments, the transistors M1 and M2 are implemented with metal-oxide-semiconductor field-effect transistors (MOSFETs). In further embodiments, the transistors M1 and M2 are operated in a triode region. During the process of generating the signal IO1, odd order signal components in the input signal VIN+ are canceled by the odd order signal components in the input signal VIN−. Accordingly, the signal IO1 is associated with even order signal components. In some embodiments, the amplitude of the even order signal components in the signal IO1 is inversely proportional to the amplitude of the input signals VIN+ and VIN−. After the multiplier 214 multiplied the signal IO1 with the AC signal components between the input signals VIN+ and VIN−, which are expressed as (VIN+−VIN−), the signal IO2 is associated with odd order signal component, which includes, for example, the $3^{rd}$ order signal component in the AC signal components (VIN+−VIN−). In some embodiments, the $3^{rd}$ order signal component of the signal IO2 is inversely equal to the $3^{rd}$ order signal component of the signal IO5. As the output signal IO+ is the sum of the signal IO2 and the signal IO5, the $3^{rd}$ order signal components of the signals IO2 and IO5 are cancelled. Effectively, the $3^{rd}$ order signal component of the output signal IO+ is removed. The same mechanism is also applied to output signal IO−. As a result, the linearity of the low noise amplifier 110 is able to be improved. The detail operations of generating the signal IO1 are described with method shown in FIG. 3 below.

With continued reference to FIG. 2, in some embodiments, the multiplier 214 includes transistors M3 and M4, capacitors C3-C4, and resistors R3-R4. A first terminal of the transistor M3 is coupled to the output terminal 201, a second terminal of the transistor M3 is coupled to the node N1, and a control terminal of the transistor M3 is coupled to a first terminal of the capacitor C3 and a first terminal of the resistor R3. The second terminal of the capacitor C3 is configured to receive the input signal VIN+. In other words, the transistor M3 is ac-coupled to the input terminal of the low noise amplifier 110, to receive the input signal VIN+. The resistor R3 is configured to bias the transistor M3 according to a bias voltage VB3. With such arrangements, the transistor M3 is able to generate the signal IO2 at the output terminal 201, according to a multiplication of the output signal IO1 and the AC signal components (VIN+−VIN−).

A first terminal of the transistor M4 is coupled to the output terminal 202, a second terminal of the transistor M4 is coupled to the node N1, and a control terminal of the transistor M4 is coupled to a first terminal of the capacitor C4 and a first terminal of the resistor R4. The second terminal of the capacitor C4 is configured to receive the input signal VIN−. Effectively, the transistor M4 is ac-coupled to another input terminal of the low noise amplifier 110, to receive the input signal VIN−. The resistor R4 is configured to bias the transistor M4 according to a bias voltage VB4. The transistor M4 is able to generate a signal IO3 at the output terminal 202 according to a multiplication of IO1 and AC signal components in AC signals between the input signal VIN− and the input signal VIN+, which are expressed as (VIN−−VIN+).

With continued reference to FIG. 2, in some embodiments, the amplifier 220 includes a transistor M5, a capacitor C5, and a resistor R5. A first terminal of the transistor M5 is coupled to the output terminal 201, a second terminal of the transistor M5 is coupled to ground, and a control terminal of the transistor M5 is coupled to a first terminal of the capacitor C5 and a first terminal of the resistor R5. The second terminal of the capacitor C5 is configured to receive the input signal VIN+. In other words, the transistor M5 is ac-coupled to an input terminal (not shown) of the device 100 in FIG. 1, to receive the input signal VIN+. The resistor R5 is configured to bias the transistor M5 according to a bias voltage VB5. In some embodiments, the transistor M5 is operated at a saturation region. Accordingly, the transistor M5 is able to generate the signal IO5 according to AC signal components in the signal VIN+ with a predetermined gain. The signal IO5 and the signal IO2 are then summed up at the output terminal 201, to generate the signal IO+ without $3^{rd}$ order signal component.

Effectively, the low noise amplifier 110 in FIG. 2 utilizes two-stages of circuits, i.e., the gain stage 210 and the amplifier 220, in order to provide a higher gain to amplify the input signal VIN+. In some approaches, a low noise amplifier is configured to utilize an additional stage for only removing the odd order signal components in the input signal without providing a signal gain. As a result, the power consumption of the additional stage is wasted. Compared with such approaches, the gain stage 210 not only improves the linearity of the low noise amplifier 110, but also provides an additional signal gain. As a result, under the same gain, the low noise amplifier 110 is able to achieve a lower power consumption and a higher linearity than the low noise amplifiers in such approaches.

Figure 3:
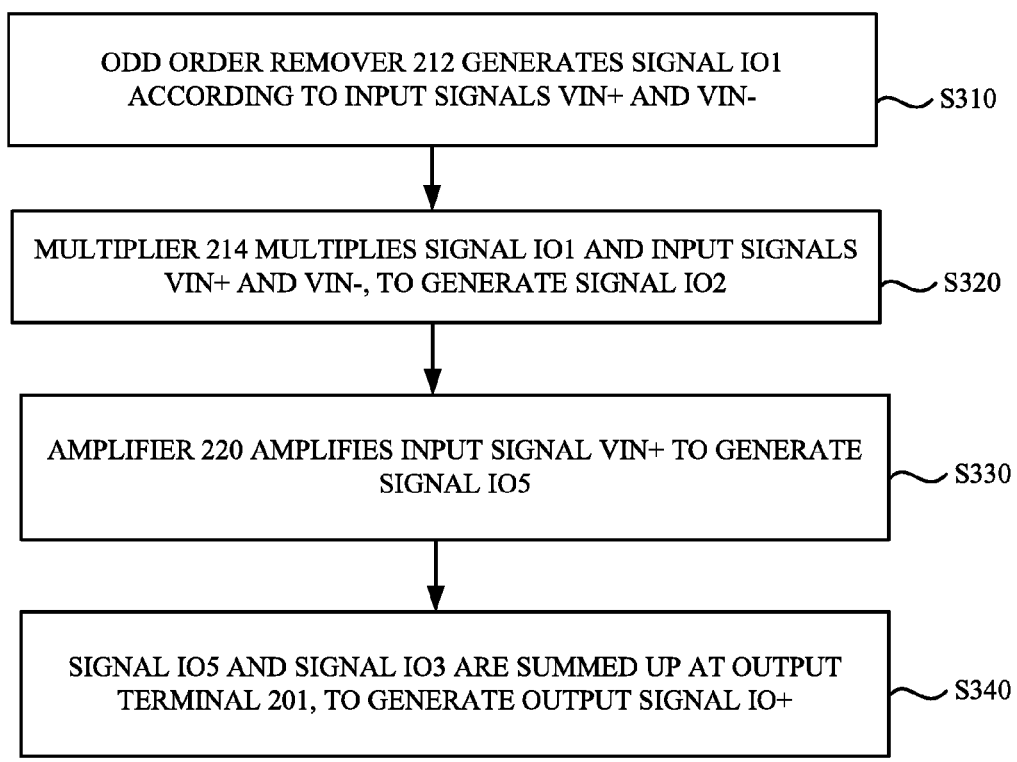
FIG. 3 is a flow chart of a method, in accordance with some embodiments of the present disclosure.

FIG. 3 is a flow chart of a method 300, in accordance with some embodiments of the present disclosure. For ease of understanding, reference is now made to FIGS. 2-3, and the operations of the method 300 are described with the low noise amplifier 110 in FIG. 2. In some embodiments, the method 300 includes operations S310-S340.

In operation S310, the odd order remover 212 generates the signal IO1 according to the input signals VIN+ and VIN−. As described above, the transistors M1 and M2 are operated in the triode region. Accordingly, odd order signal components in the input signal VIN+ are canceled by the odd order signal components in the input signal VIN−. Effectively, the odd order signal components in the input signals VIN+ and VIN− are removed. Moreover, the even order signal components have negative coefficients. The signal IO1 is able to be derived as the following equation (1):

$$IO1 = a0 - a2 \times VIN^2 - a4 \times VIN^4 - a6 \times VIN^6 - \quad (1)$$

Where a0, a2, a4, a6 are gain terms introduced by the odd order remover 212, VIN is the amplitude between the input signals VIN+ and VIN−.

In operation S320, the multiplier 214 multiplies the signal IO1 and the input signals VIN+ and VIN−, to generate the signal IO2. Accordingly, the signal IO2 is able to be derived as the following equation (2):

$$IO2 = K1 \times IO1 \times VIN \quad (2)$$

Where K1 is intrinsic gain provided by the multiplier 214.

In operation S330, the amplifier 220 amplifies the input signal VIN+, to generate the signal IO5. In operation S340, the signal IO5 and the signal IO3 are summed up at the output terminal 201, to generate the output signal IO+.

As described above, the transistor M5 in FIG. 2 is operated at the saturation region. Effectively, the transistor M5 operates as the amplifier to generate the signal IO5 according to the input signal VIN+ to the output terminal 201. The signal IO5 is able to be derived as the following equation (3):

$$IO5 = c0 + c1 \times VIN + c2 \times VIN^2 + c3 \times VIN^3 + \quad (3)$$

Where c0, c1, c2, and c3 are gain terms introduced by the amplifier 210.

As shown in FIG. 2, the signal IO5 and the signal IO2 are flowing through the output terminal 201. Effectively, the output signal IO+ is generated by summing the signal IO5 and the signal IO. The output signal IO+ is able to be derived as following equation (4), in which the equation (2) is further substituted for the signal IO2.

$$IO+ = IO2 + IO5$$
$$= c0 + (c1 + k1 \times a0)VIN + (C3 - k1 \times a2)VIN^3 + \quad (4)$$

From the equation (4), the overall gain of the low noise amplifier 110 in FIG. 1 substantially includes a first order signal gain (C1+k1×a0), a $3^{rd}$ order coefficient (C3−k1×a2), and other higher order components. While the coefficients of higher order components are relatively small and thus are able to be ignored. In various embodiments, the $3^{rd}$ order coefficient (C3−k1×a2) is configured to be zero, and thus the $3^{rd}$ order signal component in the output signal IO+ is effectively removed. The same mechanism is also applied to output signal IO−. Accordingly, the impact of the $3^{rd}$ order signal components in the input signals VIN+ and VIN− are able to be eliminated, and the linearity of the low noise amplifier 110 in is thus improved. In some embodiments, the $3^{rd}$ order coefficient (C3−k1×a2) is set to be zero by adjusting parameters of the low noise amplifier 110 in FIG. 1. For example, in further embodiments, the parameters include at least one of the bias voltages VB1-VB5. In other embodiments, the parameters include at least one of feature sizes of the transistor M1-M5.

The arrangements of adjusting the parameters of the low noise amplifier 110 in FIG. 1 are given for illustrative purposes. Various arrangements of adjusting the parameters of the low noise amplifier 110 in FIG. 1 are within the contemplated scope of the present disclosure.

The above description of the method 300 includes exemplary operations, but the operations of the method 300 are not necessarily performed in the order described. The order of the operations of the method 300 disclosed in the present disclosure are able to be changed, or the operations are able to be executed simultaneously or partially simultaneously as appropriate, in accordance with the spirit and scope of various embodiments of the present disclosure.

Figure 4:
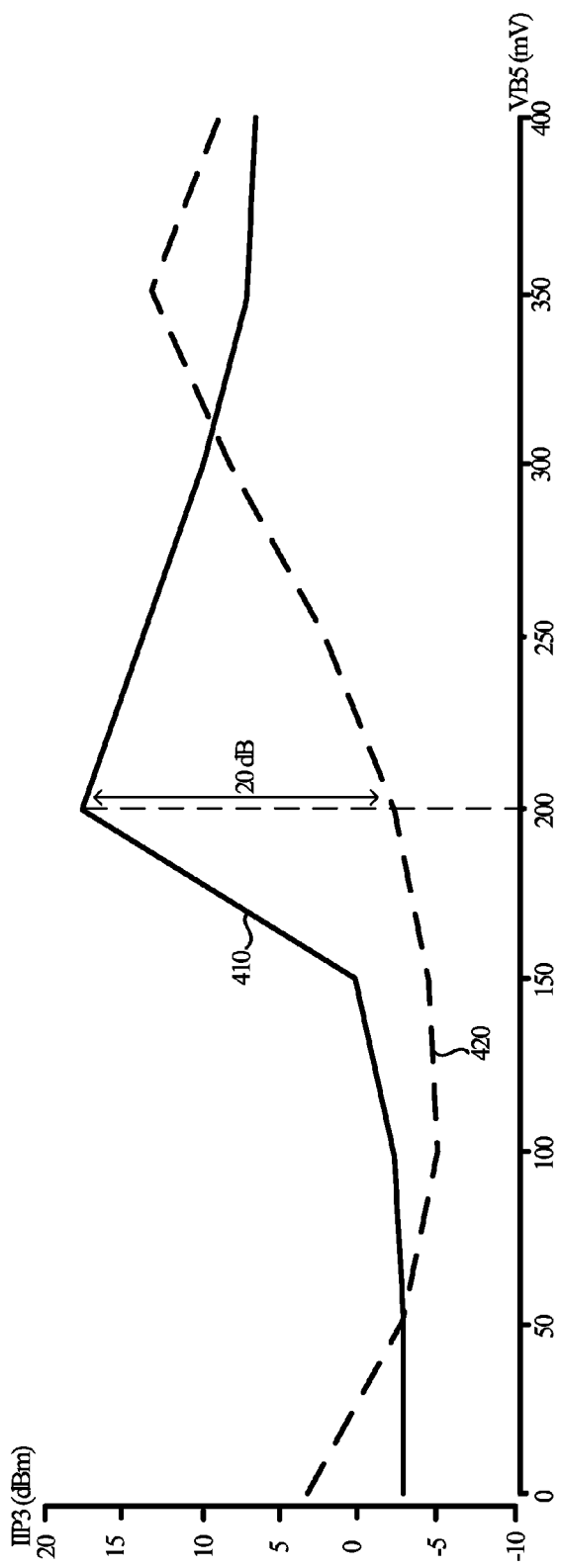
FIG. 4 illustrates IIP3 curves of the low noise amplifier in FIG. 1 with and without the gain stage in FIG. 2.

Reference is now made to FIG. 4. FIG. 4 illustrates IIP3 curves the low noise amplifier 110 in FIG. 1 with and without the gain stage 210 in FIG. 2.

As illustratively shown in FIG. 4, an input three-order intercept point (IIP3) of the low noise amplifier 110 in FIG. 2 is tested. The IIP3 is an index used to characterize the linearity of an amplifier. The IIP3 of the low noise amplifier 110 with the gain stage 210 is tested as a curve 410. The IIP3 of the low noise amplifier without the gain stage 210 in some approaches is tested as a curve 420. Compared with the curve 420, when the amplifier 220 is biased at about 200 mill volts (mV), the IIP3 of the curve 410 is able to be higher than about 20 decibel (dB). In other words, with the arrangement of the gain stage 210, the low noise amplifier 110 is able to have a higher linearity when being biased at a near-threshold voltage. As a result, compared with the approaches without using the gain stage 210, the low noise amplifier 110 is able to have a higher linearity with lower power consumption.

Figure 5:
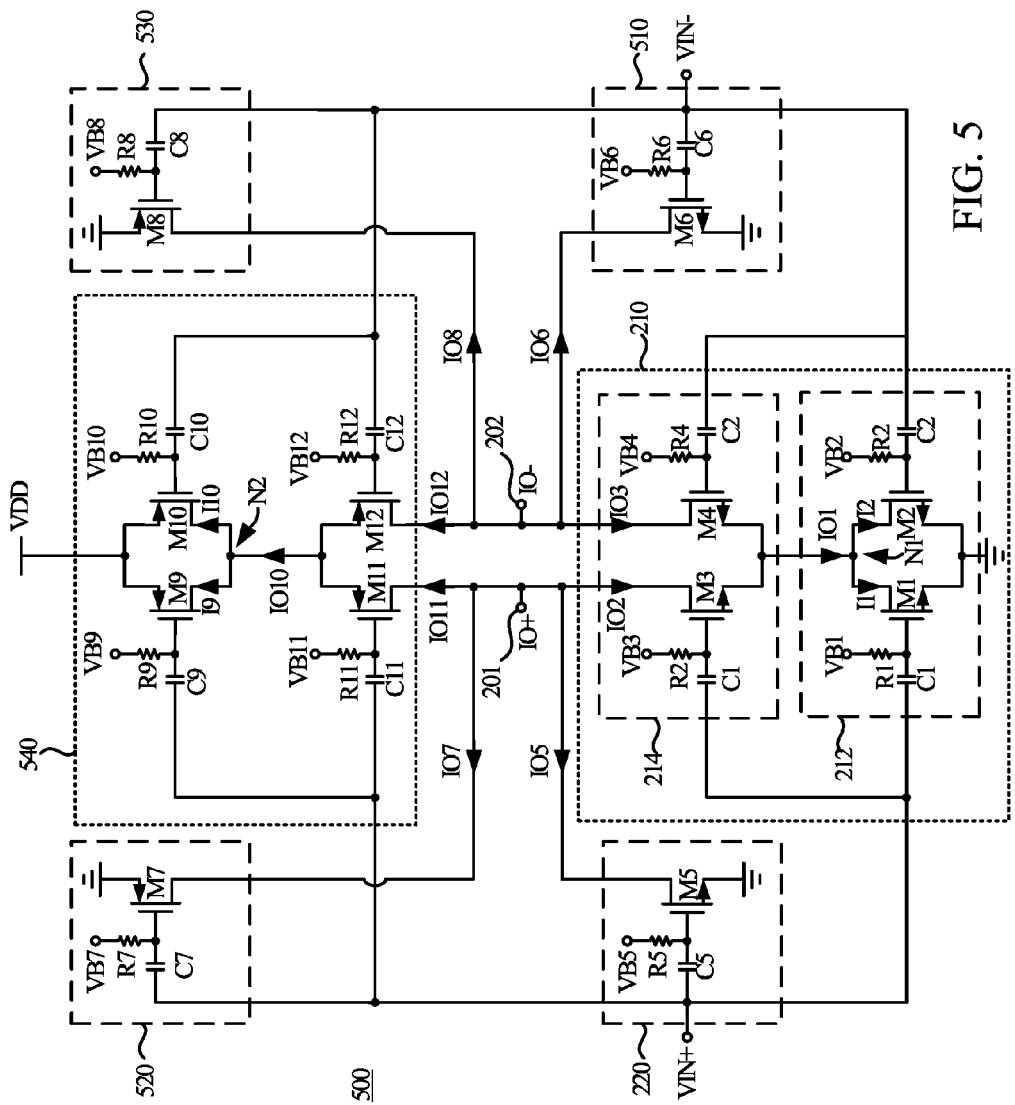
FIG. 5 is a circuit diagram of the low noise amplifier, in accordance with some alternative embodiments of the present disclosure.

Reference is now made to FIG. 5. FIG. 5 is a circuit diagram of the low noise amplifier 500, in accordance with some alternative embodiments of the present disclosure. With respect to the embodiments of FIGS. 1-2, like elements in FIG. 5 are designated with the same reference numbers for ease of understanding.

Compared with the low noise amplifier 110 in FIG. 2, the low noise amplifier 500 further includes amplifiers 510, 520, and 530, and a gain stage 540. The amplifier 510 is configured to generate a signal IO6 at the output terminal 202 according to the input signal VIN−. As shown in FIG. 5, an output signal IO− is able to be generated by summing the signal IO3 and the signal IO6. Accordingly, a fully differential output is achieved. In some embodiments, the amplifier 510 includes a transistor M6, a capacitor C6, and a resistor R6. A first terminal of the transistor M6 is coupled to the output terminal 202, a second terminal of the transistor M6 is coupled to ground, and a control terminal of the transistor M6 is coupled to a first terminal of the capacitor C6 and a first terminal of the resistor R6. The second terminal of the capacitor C6 is configured to receive the input signal VIN−. The resistor R6 is configured to bias the transistor M6 according to a bias voltage VB6. Corresponding to the transistor M5, in some embodiments, the transistor M6 is operated at the saturation region. Accordingly, the transistor M6 is able to generate the signal IO6 according to AC signal components in the signal VIN− with a predetermined gain.

In some embodiments, the amplifiers 520 and 530 and the gain stage 540 are stacked on the amplifiers 220 and 510 and the gain stage 210. The amplifiers 520 and 530 and the gain stage 540 are coupled to the amplifiers 220 and 510 and the gain stage 210 at the output terminals 201 and 202. In some embodiments, the amplifiers 520 and 530 and the gain stage 540 are operated as a counterpart circuit of the amplifiers 220 and 510 and the gain stage 210.

For illustration, the amplifier 520 includes a transistor M7, a capacitor C7, and a resistor R7. A first terminal of the transistor M7 is coupled to ground, a second terminal of the transistor M7 is coupled to the output terminal 201, and a control terminal of the transistor M7 is coupled to a first terminal of the capacitor C7 and a first terminal of the resistor R7. The second terminal of the capacitor C7 is configured to receive the input signal VIN+. The resistor R7 is configured to bias the transistor M7 according to a bias voltage VB7. In some embodiments, the transistor M7 is operated at the saturation region, to generate a signal IO7 at the output terminal 201 according to AC signal components in the input signal VIN+ with a predetermined gain.

The amplifier 540 includes a transistor M8, a capacitor C8, and a resistor R8. A first terminal of the transistor M8 is coupled to ground, a second terminal of the transistor M8 is coupled to the output terminal 202, and a control terminal of the transistor M8 is coupled to a first terminal of the capacitor C8 and a first terminal of the resistor R8. The second terminal of the capacitor C7 is configured to receive the input signal VIN−. The resistor R8 is configured to bias the transistor M8 according to a bias voltage VB8. In some embodiments, the transistor M8 is operated at the saturation region, to generate a signal IO8 at the output terminal 202 according to AC signal components in the input signal VIN− with a predetermined gain.

Moreover, the gain stage 540 includes transistor M9-M12, capacitor C9-C12, and resistors R9-R12. The transistors M9 and M10 are configured to operate as the odd order remover of the gain stage 540. In some embodiments, corresponding to the transistors M1-M2, the transistors M9-M10 are operated at the triode region. The transistors M11 and M12 are configured to operate as the multiplier of the gain stage 540.

In greater detail, a first terminal of the transistor M9 is configured to receive a voltage VDD, a second terminal of the transistor M9 is coupled to a node N2, and a control terminal of the transistor M9 is coupled to a first terminal of the capacitor C9 and a first terminal of the resistor R9. The second terminal of the capacitor C9 is configured to receive the input signal VIN+. The resistor R9 is configured to bias the transistor M9 according to a bias voltage VB9. The transistor M9 is configured to generate a current I9 at the node N2 according to the AC signal components in the signal VIN+. A first terminal of the transistor M10 is configured to receive the voltage VDD, a second terminal of the transistor M10 is coupled to the node N2, and a control terminal of the transistor M10 is coupled to a first terminal of the capacitor C10 and a first terminal of the resistor R10. The second terminal of the capacitor C10 is configured to receive the input signal VIN−. The resistor R10 is configured to bias the transistor M10 according to a bias voltage VB10. The transistor M10 is configured to generate a current I10 at the node N2 according to the AC signal components in the signal VIN−. Accordingly, a signal IO10 is generated by summing the current I9 and the current I10.

A first terminal of the transistor M11 is coupled to the node N2, a second terminal of the transistor M11 is coupled to the output terminal 201, and a control terminal of the transistor M11 is coupled to a first terminal of the capacitor C11 and a first terminal of the resistor R11. The second terminal of the capacitor C11 is configured to receive the input signal VIN+. The resistor R11 is configured to bias the transistor M11 according to a bias voltage VB11. With such arrangements, the transistor M11 is able to generate the signal IO11 at the output terminal 201, according to AC signal components in the signal VIN+. In other words, in the embodiments illustrated in FIG. 5, the output signal IO+ is generated by summing the signals IO2, IO5, IO7, and IO11. Effectively, compared with the low noise amplifier 110 in FIG. 2, the gain provided by the low noise amplifier 500 is increased.

A first terminal of the transistor M12 is coupled to the node N2, a second terminal of the transistor M12 is coupled to the output terminal 202, and a control terminal of the transistor M12 is coupled to a first terminal of the capacitor C12 and a first terminal of the resistor R12. The second terminal of the capacitor C12 is configured to receive the input signal VIN−. The resistor R12 is configured to bias the transistor M12 according to a bias voltage VB12. With such arrangements, the transistor M12 is able to generate the signal IO12 at the output terminal 201, according to AC signal components in the signal VIN−. In other words, in the embodiments illustrated in FIG. 5, the output signal IO− is generated by summing the signals IO3, IO6, IO8, and IO12.

The arrangements of ac-coupling of each transistor in the embodiments above are given for illustrative purposes. Various arrangements of the coupling between each transistor and the input signals are within the contemplated scope of the present disclosure. For example, in some other embodiments, parts of the transistors in the embodiments above are able to receive the input signals VIN+ and VIN− directly, i.e., the corresponding capacitor and the resistor are omitted, according to requirements of practical applications.

For ease of understanding, the transistors in the embodiments illustrated above are described with MOSFETs. Various types of the transistors are able to applied in the low noise amplifier 110 in FIG. 2 or the low noise amplifier 500 in FIG. 5. Accordingly, various types of the transistors M1-M12 are within contemplated scope of the present disclosure.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device is disclosed that includes a first gain stage and a first amplifier. The first gain stage is configured to generate a first signal according to a first input signal, and to multiply the first signal and the first input signal, to generate a second signal at a first output terminal, in which the first signal is associated with the even order signal components of the first input signal. The first amplifier is configured to amplify the first input signal to generate a third signal at the first output terminal, in order to output a first output signal with the first gain stage, in which the first output signal is the sum of the second signal and the third signal.

Also disclosed is a device that includes an odd order remover and a multiplier. The odd order remover is configured to generate a first signal according to a first input signal, in which the first signal is associated with even order signal components in the first input signal. The multiplier is configured to multiply the first input signal and the first signal, to generate a second signal at a first output terminal.

Also disclosed is a method that includes the operation below. A first signal is generated by an odd order remover according to a first input signal. The first input signal and the first signal are multiplied by a multiplier, to generate a second signal at a first output terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a first gain stage configured to remove odd order components associated with a first input signal in order to generate a first signal according to the first input signal, and configured to multiply the first signal and the first input signal, to generate a second signal at a first output terminal, wherein the first signal is associated with even order signal components of the first input signal; and
   a first amplifier configured to amplify the first input signal to generate a third signal at the first output terminal, in order to output a first output signal with the first gain stage, wherein the first output signal is the sum of the second signal and the third signal.

2. The circuit of claim 1, wherein the first amplifier comprises:
   a transistor configured to generate the third signal at the first output terminal according to the first input signal.

3. The circuit of claim 1, wherein the first gain stage comprises:
   an odd order remover configured to generate the first signal at a node according to the first input signal; and
   a multiplier coupled to the node, and configured to multiply the first signal and the first input signal, to generate the second signal.

4. The circuit of claim 3, wherein the odd order remover comprises:
   a first transistor configured to generate a first current at the node according to the first input signal; and
   a second transistor configured to generate a second current at the node according to a second input signal, wherein the first signal is the sum of the first current and the second current.

5. The circuit of claim 4, wherein the first input signal and the second input signal are different in phase by about 180 degrees.

6. The circuit of claim 4, wherein the first input signal and the second input signal correspond to different inputs of the first gain stage.

7. The circuit of claim 4, wherein the multiplier comprises:
   a third transistor coupled to the node, and configured to generate the second signal at the first output terminal according to the first input signal; and
   a fourth transistor coupled to the node, and configured to be controlled according to the second input signal.

8. The circuit of claim 7, wherein the fourth transistor is further configured to generate a fourth signal at a second output terminal according to the second input signal, and the circuit further comprises:
   a second amplifier configured to amplify the second input signal to generate a fifth signal at the second output terminal, in order to output a second output signal with the fourth transistor, wherein the second output signal is the sum of the fourth signal and the fifth signal.

9. The circuit of claim 8, further comprising:
   a third amplifier configured to amplify the first input signal to generate a sixth signal at the first output terminal;
   a fourth amplifier configured to amplify the second input signal to generate a seventh signal at the second output terminal; and
   a second gain stage configured to generate an eighth signal according to the first input signal and the second input signal, and to multiply the eighth signal, the first input signal, and the second input signal, to generate an ninth signal at the first output terminal and an tenth signal at the second output terminal,
   wherein the first output signal is the sum of the second signal, the third signal, the sixth signal, and the ninth signal, and the second output signal is the sum of the fourth signal, the fifth signal, the seventh signal, and the tenth signal.

10. The circuit of claim 9, wherein the third amplifier, the fourth amplifier, and the second gain stage are stacked on the first amplifier, the second amplifier, and the first gain stage.

11. A circuit, comprising:
    an odd order remover configured to operate as a square current generator in order to generate a first signal according to a first input signal, wherein the first signal is associated with even order signal components in the first input signal; and
    a multiplier configured to multiply the first input signal and the first signal, to generate a second signal at a first output terminal.

12. The circuit of claim 11, wherein the odd order remover comprises:
    a first transistor configured to generate a first current at a first node according to the first input signal; and
    a second transistor configured to generate a second current at the first node according to a second input signal, wherein the first signal is the sum of the first current and the second current.

13. The circuit of claim 12, wherein the first transistor and the second transistor are operated at a triode region.

14. The circuit of claim 11, wherein the multiplier comprises:
    a third transistor coupled to a first node, and configured to generate the second signal at the first output terminal according to the first input signal; and a fourth transistor coupled to the first node, and configured to generate a third signal to a second output terminal according to a second input signal.

15. The circuit of claim 14, further comprises:
a first amplifier configured to generate a fourth signal to the first output terminal according to the first input signal, in order to generate a first output signal with the multiplier, wherein the first output signal is the sum of the fourth signal and the second signal; and
a second amplifier configured to generate a fifth signal to the second output terminal according to the second input signal, in order to generate a second output signal with the multiplier, wherein the second output signal is the sum of the third signal and the fifth signal.

16. The circuit of claim 15, further comprises:
a third amplifier configured to amplify the first input signal to generate a sixth signal at the first output terminal;
a fourth amplifier configured to amplify the second input signal to generate a seventh signal at the second output terminal; and
a second gain stage configured to generate a eighth signal according to the first input signal and the second input signal, and to multiply the eighth signal, the first input signal, and the second input signal, to generate an ninth signal at the first output terminal and an tenth signal at the second output terminal,
wherein the first output signal is the sum of the second signal, the fourth signal, the sixth signal, and the ninth signal, and the second output signal is the sum of the third signal, the fifth signal, the seventh signal, and the tenth signal.

17. The circuit of claim 16, wherein the third amplifier, the fourth amplifier, and the second gain stage are stacked on the first amplifier, the second amplifier, the odd order remover, and the multiplier.

18. A method, comprising:
generating, by an odd order remover configured to operate as a square current generator, a first signal according to a first input signal; and
multiplying, by a multiplier, the first input signal and the first signal, to generate a second signal at a first output terminal.

19. The method of claim 18, further comprising:
amplifying, by a first amplifier, the first input signal, to generate a third signal at the first output terminal; and
summing the second signal and the third signal, to generate a first output signal.

20. The method of claim 18, wherein the generating the first signal comprises:
generating, by a first transistor of the odd order remover, a first current according to the first input signal;
generating, by a second transistor of the odd order remover, a second current according to a second input signal, wherein the first transistor and the second transistor are operated at a triode region; and
summing the first current and the second current to generate the first signal.

* * * * *